United States Patent
Gros-Jean et al.

(10) Patent No.: US 11,677,024 B2
(45) Date of Patent: Jun. 13, 2023

(54) FEFET TRANSISTOR

(71) Applicant: STMicroelectronics (Crolles 2) SAS, Crolles (FR)

(72) Inventors: Mickael Gros-Jean, Grenoble (FR); Julien Ferrand, Longechenal (FR)

(73) Assignee: STMicroelectronics (Crolles 2) SAS, Crolles (FR)

(*) Notice: Subject to any disclaimer, the term of this patent is extended or adjusted under 35 U.S.C. 154(b) by 0 days.

(21) Appl. No.: 17/323,545

(22) Filed: May 18, 2021

(65) Prior Publication Data

US 2021/0280721 A1    Sep. 9, 2021

Related U.S. Application Data

(62) Division of application No. 16/437,067, filed on Jun. 11, 2019, now Pat. No. 11,043,591.

(30) Foreign Application Priority Data

Jun. 15, 2018 (FR) ........................ 1870707

(51) Int. Cl.
*H01L 29/78* (2006.01)
*H01L 21/28* (2006.01)
(Continued)

(52) U.S. Cl.
CPC .... *H01L 29/78391* (2014.09); *H01L 27/0705* (2013.01); *H01L 29/40111* (2019.08);
(Continued)

(58) Field of Classification Search
CPC ............ H01L 29/517; H01L 29/78391; H01L 29/40111; H01L 27/705; H01L 29/516; H01L 29/6684; H01L 27/11307
(Continued)

(56) References Cited

U.S. PATENT DOCUMENTS

2014/0070289 A1    3/2014 Tanaka et al.
2016/0064510 A1*   3/2016 Mueller et al. ....... H01L 29/516
                                                                   257/295
(Continued)

FOREIGN PATENT DOCUMENTS

DE    102004011432 A1    9/2005
EP         3185281 A1    6/2017

OTHER PUBLICATIONS

INPI Search Report and Written Opinion for FR 1870707 dated Feb. 28, 2019 (8 pages).

*Primary Examiner* — Thinh T Nguyen

(74) *Attorney, Agent, or Firm* — Crowe & Dunlevy

(57) ABSTRACT

A method for manufacturing first and second transistors on a semiconductor substrate includes: depositing an interface layer on the semiconductor substrate; depositing a gate insulator layer on the interface layer; depositing a first ferroelectric layer on the gate insulator layer over a first region for the first transistor; depositing a metal gate layer on the gate insulator layer over a second region for the second transistor and on the first ferroelectric layer over the first region for the first transistor; and patterning the metal gate layer, first ferroelectric layer, gate insulator layer and interface layer to form a first gate stack for the first transistor which includes the metal gate layer, first ferroelectric layer, gate insulator layer and interface layer and a second gate stack for the second transistor which includes the metal gate layer, gate insulator layer and interface layer.

23 Claims, 5 Drawing Sheets

(51) Int. Cl.
*H01L 27/07* (2006.01)
*H01L 29/51* (2006.01)
*H01L 29/66* (2006.01)

(52) U.S. Cl.
CPC .......... *H01L 29/516* (2013.01); *H01L 29/517* (2013.01); *H01L 29/6684* (2013.01)

(58) Field of Classification Search
USPC ..................................... 257/295, 298; 438/3
See application file for complete search history.

(56) References Cited

U.S. PATENT DOCUMENTS

2017/0178712 A1    6/2017    Van Houdt
2018/0166453 A1    6/2018    Muller

* cited by examiner

FEFET TRANSISTOR

PRIORITY CLAIM

This is a division of U.S. patent application Ser. No. 16/437,067, filed on Jun. 11, 2019, which claims the priority benefit of French Application for Patent No. 1870707, filed on Jun. 15, 2018, the contents of both of which are hereby incorporated by reference in their entirety to the maximum extent allowable by law.

TECHNICAL FIELD

The present disclosure concerns a transistor and a method for manufacturing the transistor, and more particularly a FeFET-type transistor and a method for manufacturing the FeFET-type transistor.

BACKGROUND

A FeFET-type ("Ferroelectric Field Effect Transistor") transistor is a transistor similar to a MOSFET-type ("Metal Oxide Semiconductor Field Effect Transistor") transistor where the gate insulator layer is replaced with a layer made of an insulating and ferroelectric material.

It would be desirable to improve certain aspects of known FeFET-type transistors.

SUMMARY

In an embodiment, a method is presented for manufacturing a first transistor on a semiconductor substrate, wherein a gate insulator layer is deposited on the substrate before deposition of a first ferroelectric layer.

According to an embodiment, a second MOS-type transistor is formed from the same substrate as the first transistor.

According to an embodiment, the gate insulator layer is a hafnium oxide layer.

According to an embodiment, the method also includes a step of depositing a first layer favoring the nucleation of an orthorhombic crystal structure between the gate insulator layer and the first ferroelectric layer.

According to an embodiment, the first layer favoring the nucleation of an orthorhombic crystal structure is made of a material made of one or of a combination of the following compounds: lanthanum, lanthanum oxides, germanium, germanium oxides, gadolinium, gadolinium oxides, strontium, strontium oxides, yttrium, yttrium oxides, aluminum, aluminum oxides, silicon, and silicon oxides.

According to an embodiment, the method includes steps of depositing a stack alternately including at least one second layer favoring the nucleation of an orthorhombic crystal structure and at least one second ferroelectric layer.

According to an embodiment, the stack is formed on the first ferroelectric layer.

Another embodiment provides a transistor including, between a substrate and a first ferroelectric layer, a gate insulator layer.

According to an embodiment, the gate insulator layer is a hafnium oxide layer.

According to an embodiment, the first ferroelectric layer is made of a hafnium oxide or of a zirconium oxide.

According to an embodiment, the transistor also includes an interface layer between the gate insulator layer and the substrate.

According to an embodiment, the interface layer is made of silicon oxynitride.

According to an embodiment, the first ferroelectric layer rests on a first layer favoring the nucleation of an orthorhombic crystal structure.

According to an embodiment, the transistor also includes a stack alternately having at least one second layer favoring the nucleation of an orthorhombic crystal structure and at least one second ferroelectric layer, the stack being arranged on the first ferroelectric layer.

Another embodiment provides an assembly of transistors including, inside and on top of a same substrate, a MOS type transistor and a transistor of a type described hereinabove or hereinbelow.

The foregoing and other features and advantages will be discussed in detail in the following non-limiting description of specific embodiments in connection with the accompanying drawings.

Disclosed herein is a method of manufacturing a first transistor and a second transistor on a semiconductor substrate, the method including: depositing an interface layer on the semiconductor substrate, the interface layer including silicon oxynitride; depositing a gate insulator layer on the interface layer; depositing a first ferroelectric layer on the gate insulator layer over a first region for the first transistor; depositing a metal gate layer on the gate insulator layer over a second region for the second transistor and on the first ferroelectric layer over the first region for the first transistor; and patterning the metal gate layer, first ferroelectric layer, gate insulator layer and interface layer to form a first gate stack for the first transistor which includes the metal gate layer, first ferroelectric layer, gate insulator layer and interface layer and a second gate stack for the second transistor which includes the metal gate layer, gate insulator layer and interface layer.

The second transistor may be a MOS-type transistor.

The gate insulator layer may include hafnium oxide.

The method may further include depositing a first layer between the gate insulator layer and the first ferroelectric layer, the first layer favoring nucleation of an orthorhombic crystal structure.

The first layer may be made of one compound or of a combination of compounds selected from the group consisting of: lanthanum, lanthanum oxides, germanium, germanium oxides, gadolinium, gadolinium oxides, strontium, strontium oxides, yttrium, yttrium oxides, aluminum, aluminum oxides, silicon, and silicon oxides.

The method may include depositing a stack between the first ferroelectric layer and the metal gate layer over the first region for the first transistor, said stack comprising a layer favoring nucleation of an orthorhombic crystal structure and a second ferroelectric layer.

The stack may be deposited on the first ferroelectric layer.

Also disclosed herein is a method of manufacturing a first transistor and a second transistor on a same semiconductor substrate, the method including: depositing an interface layer on the semiconductor substrate; depositing a gate insulator layer on the interface layer; depositing a protection layer on the gate insulator layer; opening the protection layer above a gate of the first transistor, the gate of the first transistor including at least a portion of the gate insulator layer; depositing a first ferroelectric layer on the protection layer and the gate of the first transistor; and etching portions of the first ferroelectric layer on the protection layer, and etching the protection layer, to thereby form a first ferroelectric structure over the gate of the first transistor.

The method may include depositing a gate layer on the gate insulator layer and the first ferroelectric structure.

The method may further include masking the gate layer to thereby form the gate of the first transistor and a gate of the second transistor.

The method may further include performing an annealing to enable the first ferroelectric structure to have an orthorhombic crystal structure.

The method may include: etching respective portions of the gate layer, gate insulator layer, and interface layer to expose respective portions of the semiconductor substrate; and doping the exposed portions of the semiconductor substrate to form source/drain regions of the first and second transistors.

The second transistor may be a MOS transistor.

The gate insulator layer may be formed at least in part from hafnium oxide.

The interface layer may be formed at least in part from silicon oxynitride.

The method may further include depositing a first layer between the gate insulator layer and the first ferroelectric layer, the first layer favoring nucleation of an orthorhombic crystal structure.

The first layer may be made of one compound or of a combination of compounds selected from the group consisting of: lanthanum, lanthanum oxides, germanium, germanium oxides, gadolinium, gadolinium oxides, strontium, strontium oxides, yttrium, yttrium oxides, aluminum, aluminum oxides, silicon, and silicon oxides.

DETAILED DESCRIPTION

Figure 1:
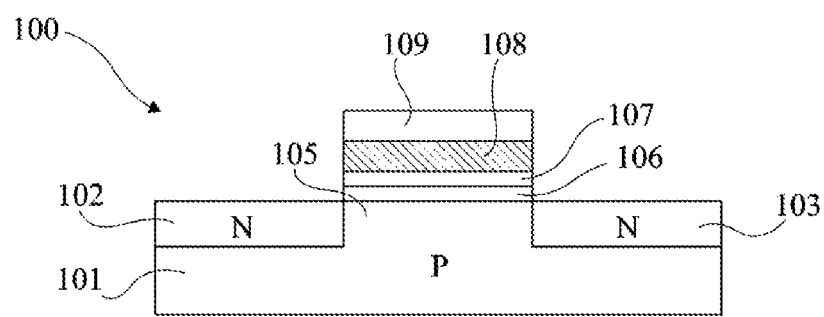
FIG. 1 is a cross-section view of an embodiment of a FeFET-type transistor.

The same elements have been designated with the same reference numerals in the different drawings. In particular, the structural and/or functional elements common to the different embodiments may be designated with the same reference numerals and may have identical structural, dimensional, and material properties.

For clarity, those steps and elements which are useful to the understanding of the described embodiments have been shown and are detailed. In particular, the operation of a FeFET-type transistor will not be detailed, be it an N-type or P-type MOS transistor, as such operation is known to those of skill in the art.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., it is referred to the orientation of the drawings.

The terms "approximately", "substantially", and "on the order of" are used herein to designate a tolerance of plus or minus 10%, preferably of plus or minus 5%, of the value in question.

FIG. 1 is a cross-section view of an embodiment of a FeFET-type transistor 100. More particularly, transistor 100 is N-type, but a P-type transistor may be formed by inverting the biasing of the structure disclosed hereafter.

Transistor 100 is formed inside and on top of a semiconductor substrate 101, for example, a lightly P-type doped. Substrate 101 is, for example, made of silicon. Source and drain regions 102 and 103 are formed from the surface of substrate 101. Regions 102 and 103 extend from the upper surface of substrate 101, and are, for example, N-type doped. Regions 102 and 103 are separated from each other by a P-type doped channel region 105. The upper surface of channel region 105 has a stack successively comprising the following elements resting thereon: an interface layer 106 resting on top of and in contact with channel region 105; a gate insulator layer 107 resting on top of and in contact with interface layer 106; an insulating ferroelectric layer 108 resting on top of and in contact with gate insulator layer 107; and a gate layer 109 resting on top of and in contact with ferroelectric layer 108.

Interface layer 106 is, for example, made of silicon oxynitride (SiON). Interface layer 106 has a thickness preferably in the range from 0.5 nm to 2 nm, for example, on the order of 1.5 nm.

Gate insulator layer 107 is, for example, made of a hafnium oxide. Gate insulator layer 107 has a thickness preferably in the range from 1 nm to 3 nm, for example, on the order of 2 nm.

Ferroelectric layer 108 is, for example, made of a hafnium oxide and/or of a zirconium oxide. The material of layer 108 has an orthorhombic crystal structure favoring the ferroelectric character of the material. Ferroelectric layer 108 has a thickness preferably in the range from 2 to 12 nm, for example, on the order of 5 nm.

Gate layer 109 is made of a gate metal, for example, of titanium nitride (TiN). Gate layer 109 has a thickness preferably in the range from 2 nm to 10 nm, for example, on the order of 5 nm.

The placing of a gate insulator layer under a ferroelectric layer enables avoiding the presence of many asperities between the ferroelectric layer and the channel region which would trap charges during a turning-on of the transistor. Such asperities are generally present in a usual FeFET transistor despite the presence of a silicon oxide interface layer.

Advantage is thus taken from the fact, for MOS-type transistors, interfaces between a gate insulator and a channel region may be formed which are "clean", that is, are interfaces comprising a density of asperities or a density of interface defects smaller than $10^{11}/cm^2$.

Figure 2A:
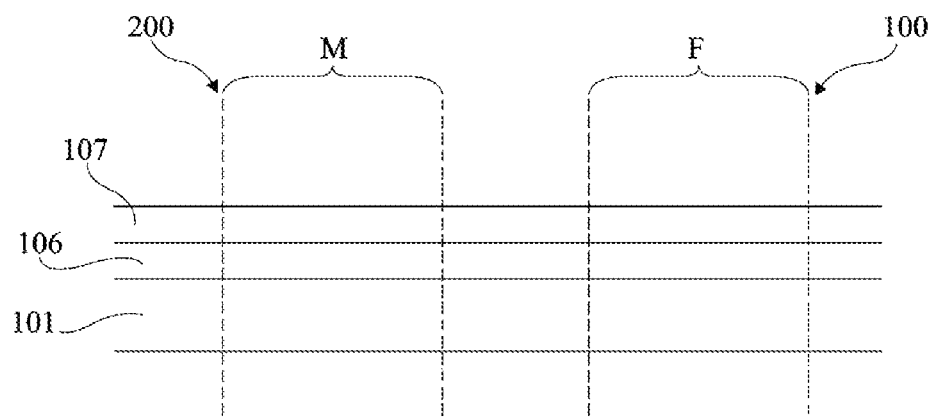
FIGS. 2A-2C shows steps of a method of manufacturing the transistor of FIG. 1.
Figure 2B:
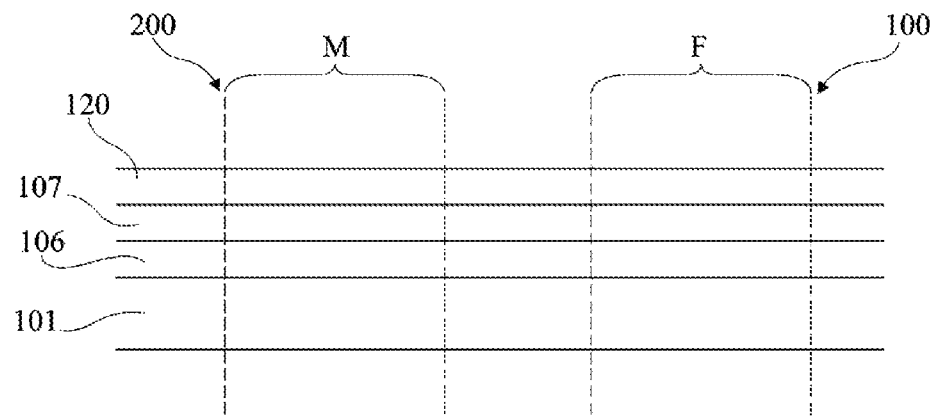
Figure 2C:
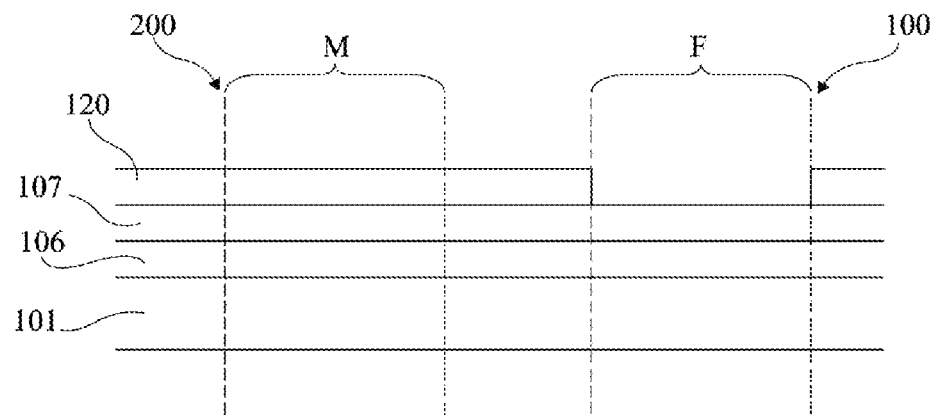
Figure 3A:
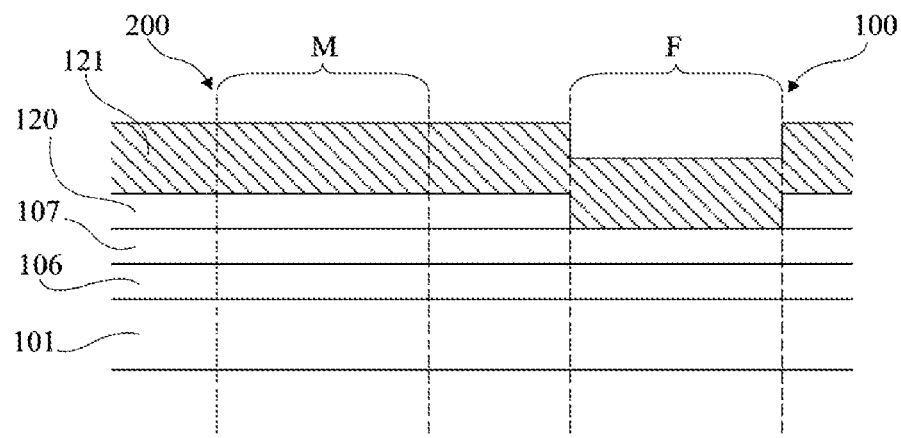
FIGS. 3A-3C show steps of a method of manufacturing the transistor of FIG. 1.
Figure 3B:
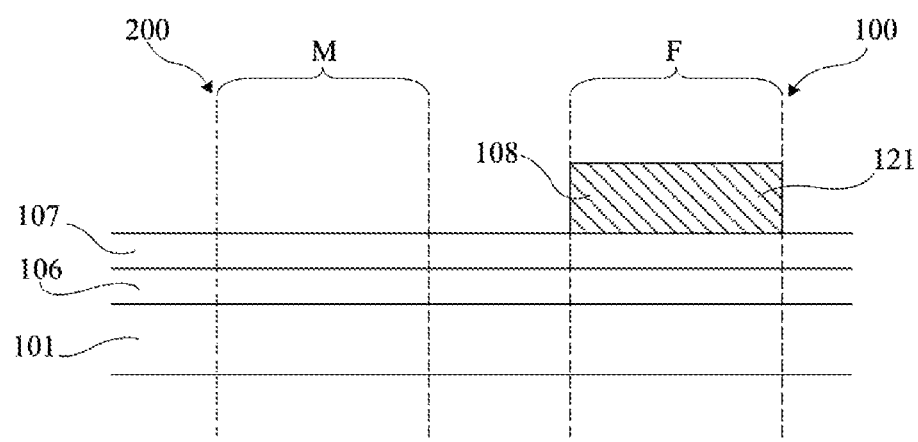
Figure 3C:
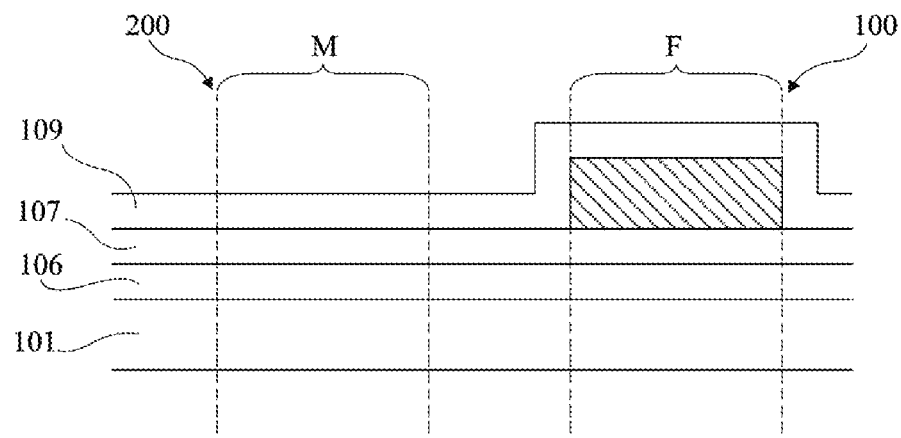

FIGS. 2 and 3 show two phases of a method of manufacturing a gate of FeFET transistor 100 of FIG. 1 in parallel with a gate of a MOS transistor 200. More particularly, each of FIGS. 2A-2C and 3A-3C comprises a cross section view, each illustrating a step of the method. Further, each cross-section view shows, in a left-hand portion M, the forming of the gate of a MOS transistor 200 and, in a right hand portion F, the forming of the gate of a FeFET transistor 100.

FIG. 2A illustrates an initial structure resulting from a plurality of successive layer deposition steps. During these steps, interface and gate insulator layers 106 and 107 have been deposited on substrate 101. Layer 106 and 107 are deposited on portion M as well as on portion F.

In FIG. 2B, a protection layer 120 is deposited on the surface of the structure of FIG. 2A (portions M and F). Protection layer 120 is made of a material selectively etchable over the material of layer 107. As an example, to be selectively etchable over hafnium oxide, protection layer 120 is made of silicon, of silicon oxide, of polysilicon, or of silicon nitride.

In FIG. 2C, a portion of protection layer 120 covering portion F of gate insulation layer 107 is removed by masking. The remaining portions of protection layer 120 then form a mask protecting portion M.

In FIG. 3A, a layer of ferroelectric material 121 is deposited on the structure illustrated in relation with FIG. 2C. More particularly, layer 121 is, for example, formed by chemical vapor deposition (CVD) or for example by atomic layer deposition (ALD). Layer 121 is made of a material identical to layer 108 described in relation with FIG. 1.

In FIG. 3B, the portion of layer 120 covering portion M and the portion of layer 121 covering it are removed by a chemical etch step, for example, a gas phase chemical etching with the use of a plasma, or in liquid phase. Thus, the remaining portion of layer 121 forms, on portion F, the ferroelectric layer 108 described in relation with FIG. 1.

In FIG. 3C, gate layer 109 described in relation with FIG. 1 is deposited on the structure described in relation with FIG. 3B. The next step is a masking step, not shown, enabling completion of formation of the gates of transistors 100 and 200. The masking step is followed by an anneal operation, for example, at a temperature on the order of 650° C. The anneal phase enables the material of layer 108 to have an orthorhombic crystal structure and to thus have a ferroelectric behavior.

Once the gates of transistors 100 and 200 have been formed, source and drain regions are formed by doping portions of substrate 101. To achieve this, the layers stacked on the concerned portions of substrate 101 are etched, after which the portions are doped by different usual methods.

An advantage of this embodiment is that the method of manufacturing the gate of FeFET transistor 100 may be implemented in parallel with a MOS-type transistor manufacturing method, which enables forming a FeFET transistor accompanied by a logic circuit formed of one or a plurality of MOS transistors.

Figure 4:
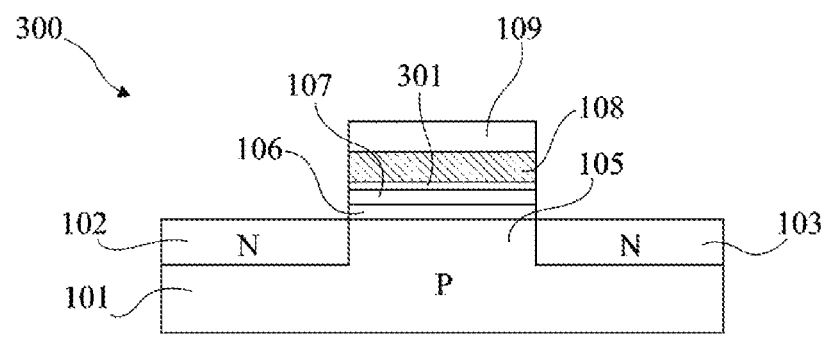
FIG. 4 illustrates another embodiment of a FeFET-type transistor.

FIG. 4 is a cross-section view of another embodiment of a FeFET-type transistor 300 similar to transistor 100 described in relation with FIG. 1. Transistor 300 comprises the same elements as transistor 100, these elements being designated with the same reference numerals in FIG. 3 as in FIG. 1.

Transistor 300 further comprises a layer 301 favoring the nucleation of an orthorhombic crystal structure. Layer 301 is arranged between gate insulator layer 107 and ferroelectric layer 108. Layer 301 is made of a material made of one or of a combination of the following compounds: lanthanum, lanthanum oxides, germanium, germanium oxides, gadolinium, gadolinium oxides, strontium, strontium oxides, yttrium, yttrium oxides, aluminum, aluminum oxides, silicon, and silicon oxides. Layer 301 has a thickness preferably in the range from 0.05 to 1 nm, for example, on the order of 0.3 nm.

The method of manufacturing a FeFET-type transistor of the type of that in FIG. 4 comprises a step of depositing a layer made of a material favoring the nucleation of an orthorhombic crystal structure on layer 107 (of the step described in relation with the step of FIG. 2B). Thus, the growth of ferroelectric layer 121 (described in relation with the step of FIG. 3A) is directly performed on the layer favoring the nucleation of an orthorhombic crystal structure and thus layer 121 has an orthorhombic crystal structure.

Figure 5:
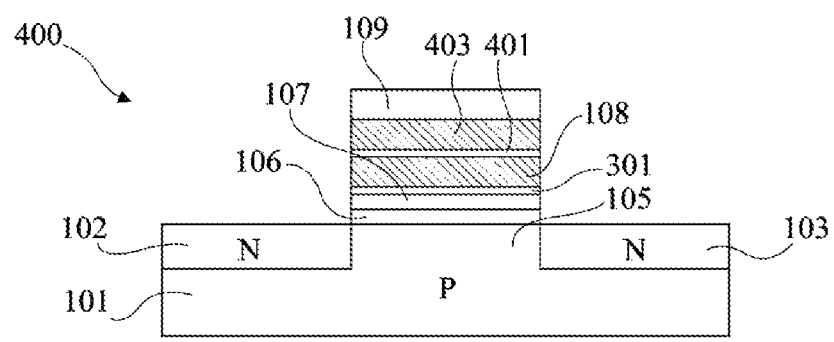
FIG. 5 illustrates still another embodiment of a FeFET-type transistor.

FIG. 5 is a cross-section view of still another embodiment of a FeFET-type transistor 400 similar to transistor 300 described in relation with FIG. 4. Transistor 400 comprises the same elements as transistor 300, these elements being designated with the same reference numerals in FIG. 5 as in FIG. 4.

In this embodiment, ferroelectric layer 108 has a thickness in the range from 2 to 5 nm, for example, on the order of 3 nm.

Transistor 400 further comprises, between gate layer 109 and ferroelectric layer 108, a stack alternately comprising layer 401 favoring the nucleation of an orthorhombic crystal structure, and ferroelectric layers 403. In FIG. 5, the stack comprises a single layer 401 and a single layer 403. Layer 401 favoring the nucleation of an orthorhombic crystal structure has the same characteristics as layer 301. Ferroelectric layer 403 has the same characteristics as layer 108.

An advantage of this embodiment is that interposing layers favoring the nucleation of an orthorhombic crystal structure between ferroelectric layers enables better control of the crystal structure of the ferroelectric layers.

The definitions of the following terms used are:
lightly-doped semiconductor layer designates a layer having a dopant atom concentration in the range from $10^{14}$ to $5 \times 10^{15}$ atoms/cm$^3$;
heavily-doped semiconductor layer designates a layer having a dopant atom concentration in the range from $10^{17}$ to $10^{18}$ atoms/cm$^3$; and
very heavily-doped semiconductor layer designates a layer having a dopant atom concentration in the range from $10^{18}$ to $10^{20}$ atoms/cm$^3$.

Specific embodiments have been described. Various alterations and modifications will occur to those skilled in the art. In particular, any insulating ferroelectric material may be used to form the electric layer.

It should be noted that those skilled in the art may combine various elements of these various embodiments and variations without showing any inventive step.

Such alterations, modifications, and improvements are intended to be part of this disclosure, and are intended to be within the spirit and the scope of this disclosure. Accordingly, the foregoing description is by way of example only and is not intended to be limiting.

The invention claimed is:

1. A method of manufacturing a first transistor and a second transistor on a semiconductor substrate, the method comprising:
    depositing an interface layer on the semiconductor substrate, the interface layer comprising silicon oxynitride;
    depositing a gate insulator layer on the interface layer;
    depositing a first ferroelectric layer on the gate insulator layer over a first region of the semiconductor substrate for the first transistor;
    during a same deposition step, depositing a metal gate layer on the gate insulator layer over a second region of the semiconductor substrate for the second transistor and on the first ferroelectric layer over the first region of the semiconductor substrate for the first transistor; and
    patterning the metal gate layer, first ferroelectric layer, gate insulator layer and interface layer to form a first gate stack for the first transistor which includes the metal gate layer, first ferroelectric layer, gate insulator layer and interface layer and a second gate stack for the second transistor which includes the metal gate layer, gate insulator layer and interface layer.

2. The method of claim 1, wherein the second transistor is a MOS-type transistor.

3. The method of claim 1, wherein the gate insulator layer is comprised of hafnium oxide.

4. The method of claim 1, further comprising depositing a first layer between the gate insulator layer and the first ferroelectric layer, the first layer favoring nucleation of an orthorhombic crystal structure.

5. The method of claim 4, wherein the first layer is made of one compound or of a combination of compounds selected from the group consisting of: lanthanum, lanthanum oxides, germanium, germanium oxides, gadolinium, gadolinium oxides, strontium, strontium oxides, yttrium, yttrium oxides, aluminum, aluminum oxides, silicon, and silicon oxides.

6. The method of claim 1, further comprising:
depositing a stack between the first ferroelectric layer and the metal gate layer over the first region of the semiconductor substrate for the first transistor, said stack comprising a layer favoring nucleation of an orthorhombic crystal structure and a second ferroelectric layer.

7. The method of claim 6, wherein the stack is deposited on the first ferroelectric layer.

8. A method of manufacturing a first transistor and a second transistor on a semiconductor substrate, the method comprising:
depositing an interface layer on the semiconductor substrate;
depositing a gate insulator layer on the interface layer;
depositing a protection layer on the gate insulator layer;
opening a first portion of the protection layer above a gate region of the first transistor, the gate region of the first transistor including at least a portion of the gate insulator layer;
depositing a first ferroelectric layer on the protection layer and the portion of the gate insulator in the gate region of the first transistor; and
removing portions of the first ferroelectric layer on the protection layer, and removing remaining portions of the protection layer, to thereby form a first ferroelectric structure over the gate region of the first transistor.

9. The method of claim 8, further comprising depositing a gate layer on the gate insulator layer and the first ferroelectric structure.

10. The method of claim 9, further comprising masking the gate layer to thereby form the gate region of the first transistor and a gate region of the second transistor.

11. The method of claim 10, further comprising performing an annealing to enable the first ferroelectric structure to have an orthorhombic crystal structure.

12. The method of claim 11, further comprising:
etching respective portions of the gate layer, gate insulator layer, and interface layer to expose respective portions of the semiconductor substrate; and
doping the exposed portions of the semiconductor substrate to form source and drain regions of the first and second transistors.

13. The method of claim 8, wherein the second transistor is a MOS transistor.

14. The method of claim 8, wherein the gate insulator layer is comprised of hafnium oxide.

15. The method of claim 8, wherein the interface layer comprises silicon oxynitride.

16. The method of claim 8, further comprising depositing a first layer between the gate insulator layer and the first ferroelectric layer, the first layer favoring nucleation of an orthorhombic crystal structure.

17. The method of claim 16, wherein the first layer is made of one compound or of a combination of compounds selected from the group consisting of: lanthanum, lanthanum oxides, germanium, germanium oxides, gadolinium, gadolinium oxides, strontium, strontium oxides, yttrium, yttrium oxides, aluminum, aluminum oxides, silicon, and silicon oxides.

18. A method of manufacturing a first transistor and a second transistor on a semiconductor substrate, the method comprising:
depositing a stack of layers on the semiconductor substrate, said stack comprising:
an interface layer made of silicon oxynitride;
a gate insulator layer;
a first ferroelectric layer extending over the gate insulator layer at a first region of the semiconductor substrate for the first transistor;
a metal gate layer extending over the gate insulator layer at a second region of the semiconductor substrate for the second transistor and further extending over the first ferroelectric layer at the first region of the semiconductor substrate for the first transistor, wherein the metal gate layer is deposited in a single deposition step; and
patterning the stack of layers to form a first gate stack at the first region of the semiconductor substrate for the first transistor and form a second gate stack at the second region of the semiconductor substrate for the second transistor.

19. The method of claim 18, wherein depositing the stack further comprises depositing, between the first ferroelectric layer and the metal gate layer, at the first region of the semiconductor substrate for the first transistor, a layer favoring nucleation of an orthorhombic crystal structure and a second ferroelectric layer.

20. The method of claim 18, wherein depositing the stack further comprises depositing, between the insulator and the first ferroelectric layer, a layer favoring nucleation of an orthorhombic crystal structure.

21. The method of claim 20, wherein said layer is made of one compound or of a combination of compounds selected from the group consisting of: lanthanum, lanthanum oxides, germanium, germanium oxides, gadolinium, gadolinium oxides, strontium, strontium oxides, yttrium, yttrium oxides, aluminum, aluminum oxides, silicon, and silicon oxides.

22. The method of claim 1, wherein the first ferroelectric layer is deposited on the gate insulator layer such that it is in direct physical contact with the gate insulator layer.

23. The method of claim 8, wherein the first ferroelectric layer is deposited on the gate insulator layer such that it is in direct physical contact with the gate insulator layer.

* * * * *